United States Patent
Ito et al.

(10) Patent No.: US 8,562,323 B2
(45) Date of Patent: Oct. 22, 2013

(54) IMPRINT APPARATUS AND METHOD FOR PRODUCING ARTICLE

(75) Inventors: Hirohito Ito, Utsunomiya (JP); Nobushige Korenaga, Utsunomiya (JP); Makoto Miyazaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1 day.

(21) Appl. No.: 12/971,696

(22) Filed: Dec. 17, 2010

(65) Prior Publication Data
US 2011/0159189 A1 Jun. 30, 2011

(30) Foreign Application Priority Data
Dec. 26, 2009 (WO) .................. PCT/JP2009/071707

(51) Int. Cl.
*G03F 7/00* (2006.01)

(52) U.S. Cl.
USPC ......................................................... 425/150

(58) Field of Classification Search
USPC ......................................................... 425/150
See application file for complete search history.

(56) References Cited

U.S. PATENT DOCUMENTS

| 2002/0145721 A1 | 10/2002 | Korenaga |
| 2005/0064054 A1 | 3/2005 | Kasumi |
| 2007/0242272 A1 | 10/2007 | Suehira |

FOREIGN PATENT DOCUMENTS

| CN | 101427185 A | 5/2009 |
| CN | 101600993 A | 12/2009 |
| JP | 2000-106344 A | 4/2000 |
| JP | 2005-101201 A | 4/2005 |
| JP | 2007-266053 A | 10/2007 |
| JP | 2008-221821 A | 9/2008 |
| JP | 2008-244441 A | 10/2008 |
| JP | 2009-302088 A | 12/2009 |
| WO | 2008-099795 A2 | 8/2008 |

*Primary Examiner* — Yogendra Gupta
*Assistant Examiner* — Alison Hindenlang
(74) *Attorney, Agent, or Firm* — Canon U.S.A., Inc., IP Division

(57) ABSTRACT

An imprint apparatus is disclosed that forms, by pressing a resin applied onto a substrate and a mold against each other, a pattern on the substrate. The imprint apparatus includes a substrate stage that holds the substrate, and a control unit for controlling the position of the stage by outputting a manipulating variable on the basis of a position error between a position of the stage which has been measured by position measurement unit and a target position. The control unit reduces a ratio of the manipulating variable to the position error while the substrate and the mold are in contact with each other until mold release.

18 Claims, 7 Drawing Sheets

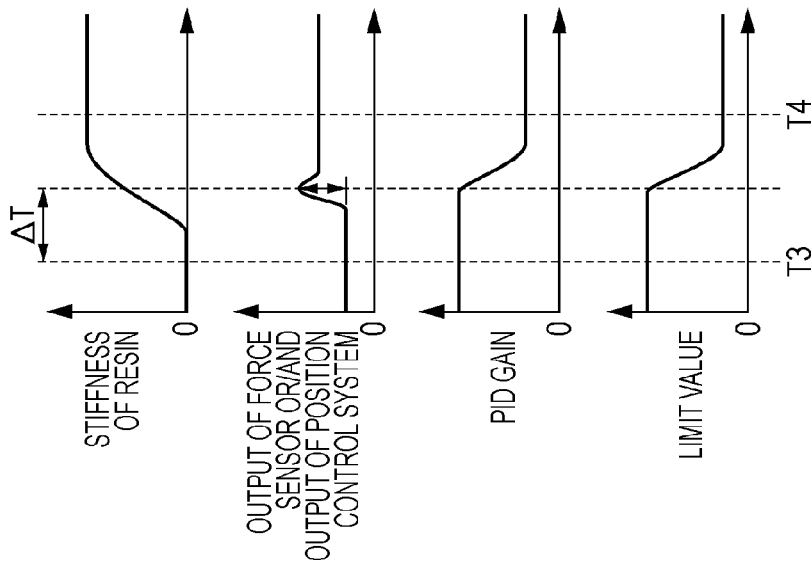
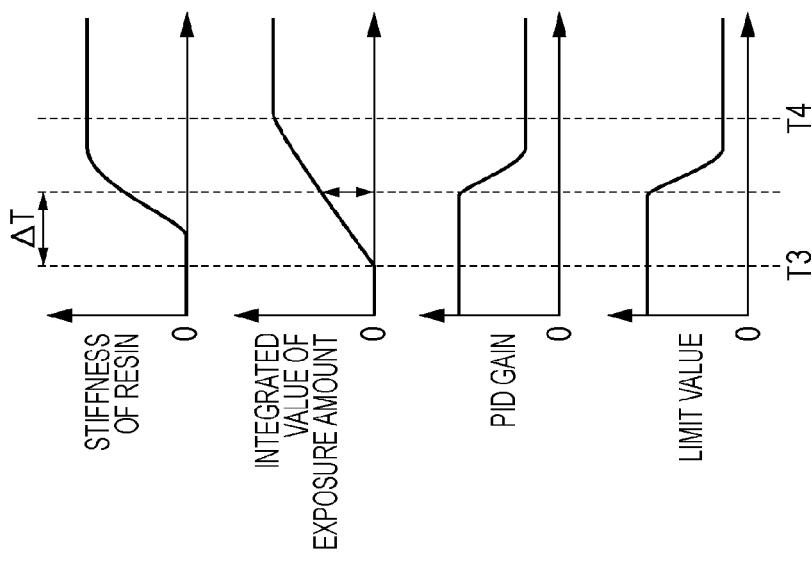
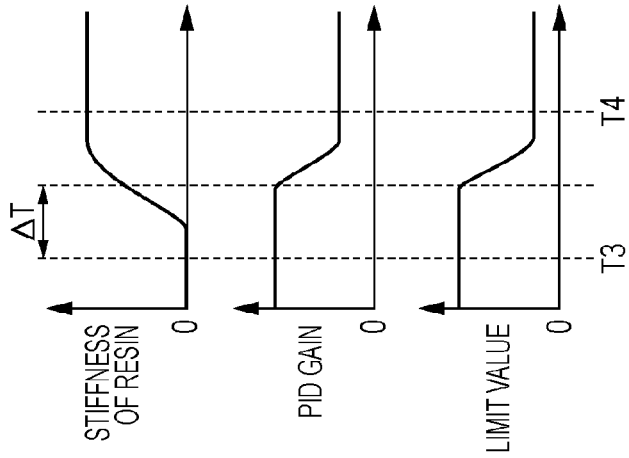

IMPRINT APPARATUS AND METHOD FOR PRODUCING ARTICLE

TECHNICAL FIELD

The present invention relates to an imprint apparatus for transferring a pattern on a mold onto a resin on a substrate.

BACKGROUND ART

An imprint technology utilizing a light curing method exists for a case of forming a recessed and projecting pattern on a substrate, such as a silicon wafer or a glass plate, using a mold, on which the recessed and projecting pattern is formed, as an original. In this technology, a light-curable resin layer is formed on a substrate. Next, alignment of a mold, on which a predetermined recessed and projecting pattern is formed, and a substrate, on which the resin layer is provided, at predetermined intervals is performed. After alignment is performed, the mold and the substrate are pressed against each other, thereby filling a recessed portion of the recessed and projecting pattern, which is formed on the mold, with a resin. Next, the resin is irradiated with light used to cure a resin, such as ultraviolet light, thereby curing the resin. Accordingly, the recessed and projecting pattern of the mold is transferred onto the resin layer. Next, after the mold and the substrate are separated from each other, etching or the like is performed using the resin layer, on which the recessed and projecting pattern is formed, as a mask, thereby forming, on the substrate, a fine structure corresponding to a fine structure of the recessed and projecting pattern that is formed on the mold. There has been a demand for microfabrication with a high fineness of the order of nanometers in these days, and the technology has attracted attention. However, in order to propel the development of the technology, further improvement in transfer accuracy and transfer speed is required. In order to meet the requirement, compatibility between a high positioning accuracy of the order of nanometers and a high movement speed is necessary for a stage on which a substrate is mounted.

As a technology capable of ensuring the compatibility, for example, a technology for a wafer stage used for a semiconductor exposure apparatus, which is described in PTL 1, exists. A fine-motion stage which is supported in a non-contact manner and on which positioning with six degrees of freedom can be performed by driving with linear motors is mounted on the wafer stage. Positioning with a high accuracy on the basis of information concerning a position that is measured by a high-accuracy laser interferometer having a resolution of nanometers or lower is made possible. Furthermore, regarding the wafer stage, high-speed movement is made possible by a coarse-motion stage having high thrust liner motors.

Citation List

Patent Literature

PTL 1 Japanese Patent Laid-Open No. 2000-106344

However, because the wafer stage used for a semiconductor exposure apparatus is controlled with a very high gain in order to achieve high-speed movement and high-accuracy positioning, a large manipulating variable is generated for a slight position error. Thus, actuators need large driving forces. As a result, when the technology for the wafer stage used for a semiconductor exposure apparatus as described in PTL 1 is applied, as it is, to the imprint technology utilizing a light curing method, in a state in which the resin is cured, the resin receives forces reactive to the driving forces, and, further, the reactive forces are transmitted to the mold side. For this reason, the fixed position of the mold and the fixed position of the substrate are shifted from each other, and, further, an excessive force is exerted on the resin. A problem that the recessed and projecting pattern is broken occurs.

In contrast, when the control gain is reduced before contact, the positioning accuracy of the substrate stage decreases, and there is a problem that the position of the recessed and projecting pattern which is to be transferred is shifted.

SUMMARY OF INVENTION

According to an aspect of the present invention, an imprint apparatus is provided which prevents a recessed and projecting pattern from being broken in the course of contacting a mold and a substrate with each other, of curing, and of mold release, in which positioning of a substrate stage at a high accuracy can be performed, and in which the substrate stage can be moved at a high speed. A method for producing an article using the imprint apparatus is also provided.

According to another aspect of the present invention, an imprint apparatus according to the present invention can form a recessed and projecting pattern on a substrate by superimposing a resin layer provided on the substrate and a mold on each other and by pressing the resin layer and the mold against each other. The imprint apparatus includes a stage that holds the substrate; and a control unit for controlling the position of the stage by outputting a manipulating variable on the basis of a position error between a position of the stage that has been measured by a position measurement unit and a target position. The control unit reduces a ratio of the manipulating variable to the position error while a resin, which is applied onto the substrate, and the mold are in contact with each other until mold release.

Further features of the present invention will become apparent from the following description of exemplary embodiments with reference to the attached drawings.

BRIEF DESCRIPTION OF DRAWINGS

FIGS. 5A to 5C timing diagrams of gain change in the first embodiment.

DESCRIPTION OF EMBODIMENTS

Hereinafter, various embodiments of the present invention will be specifically described on the basis of the accompanying drawings. Note that, in the description of the present invention, a gain indicates a ratio of an output to an input of each controller, and a gain parameter indicates a setting value for directly changing the gain.

Figure 1:
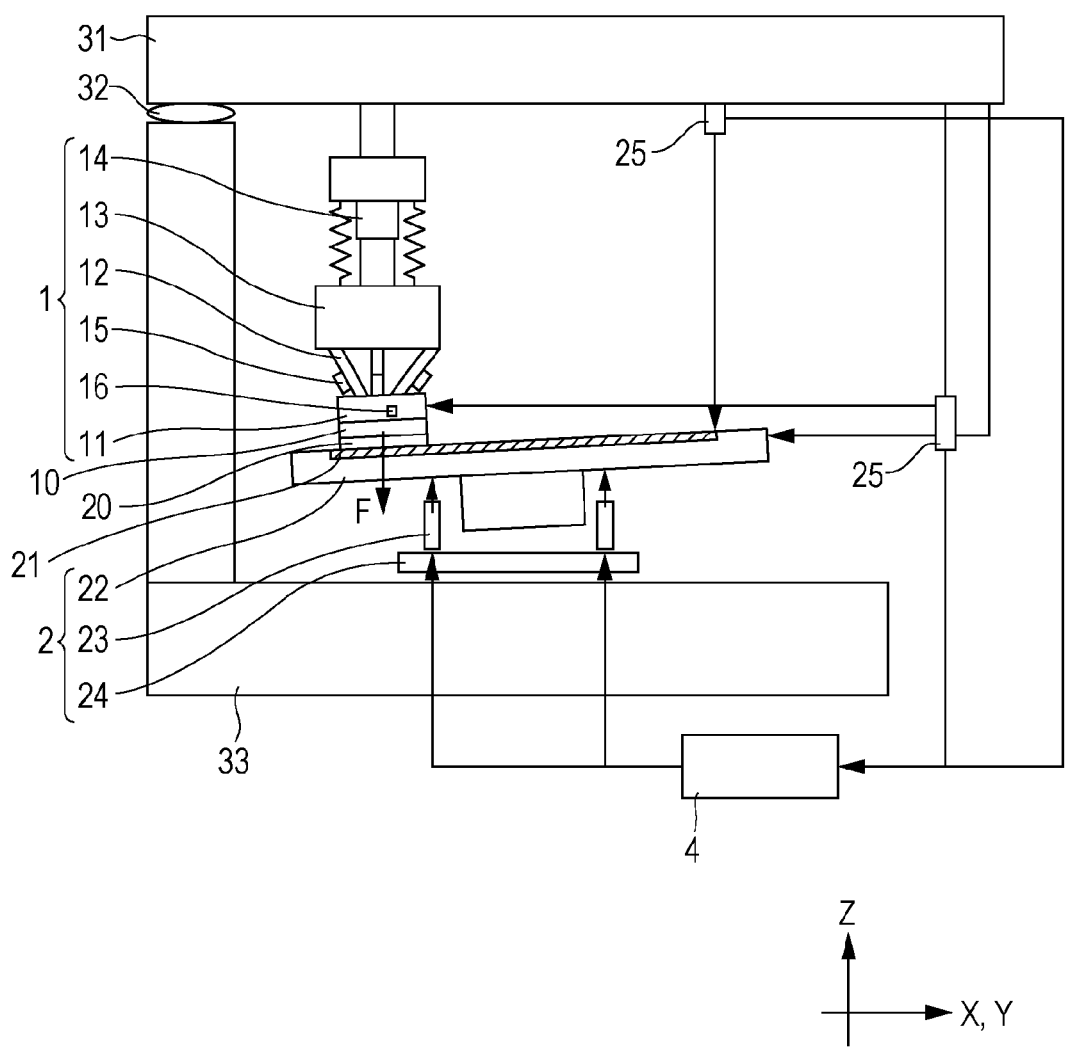
FIG. 1 is an example of a schematic configuration diagram of an imprint apparatus according to a present embodiment.

FIG. 1 is an example of a schematic configuration diagram of an imprint apparatus according to a present invention. A body 31 to which a mold supporting mechanism 1 is connected is mounted on a base 33 on which a substrate stage 2 is mounted. The body 31 has a mount 32 for vibration isolation.

The mold supporting mechanism 1 is a mechanism that supports a mold 10, and includes a mold chuck 11, a flexure mechanism 12, a supporting table 13, and an up/down mechanism 14. The mold chuck 11 is connected to the supporting table 13 via the flexure mechanism 12, and fixes the mold 10 so that the mold 10 is detachably attached to the mold chuck 11. The flexure mechanism 12 is configured using elastic hinges, and causes the substrate 21 and the mold 10 to press against each other. When a load is imposed on the mold 10, the elastic hinges sag, so that the mold 10 can be parallel to the face of the substrate 21. The supporting table 13 is connected to the body 31 via the up/down mechanism 14. The up/down mechanism 14 can determine an approximate position of the mold 10 in up/down directions in the case of pressing the mold 10 against the substrate 21. Furthermore, the up/down mechanism 14 is used for an up/down operation in the case of an operation of detaching or attaching the mold 10, and further used for withdrawal of the mold 10 if something abnormal happens.

The substrate stage 2 is a mechanism that holds the substrate 21, and includes a fine-motion stage 22 and a coarse-motion stage 24. An operation of the fine-motion stage 22 is controlled by a control device 4. The substrate 21 can be mounted on the top face of the fine-motion stage 22. The fine-motion stage 22 includes at least six linear motors 23, and positioning of the fine-motion stage 22 with six degrees of freedom can be performed. Actuators using electromagnets or the like can be used instead of the linear motors 23. Because the fine-motion stage 22 is supported in a non-contact manner by driving forces that are generated by the linear motors 23, no disturbance is transmitted from the base 33 or the coarse-motion stage 24 to the fine-motion stage 22, and positioning of the fine-motion stage 22 with a very high accuracy can be performed. The position of the fine-motion stage 22 is measured by a position measurement unit included in the body 31. As the position measurement unit, an encoder or the like can be utilized instead of the interferometer 25. In this case, the position of the mold 10 or the mold chuck 11 is also measured by the position measurement unit simultaneously, and the difference between a value of the measured position and a value of the measured position of the fine-motion stage 22 is acquired, and beneficially a relative displacement between the fine-motion stage 22 and the mold 10 can also be obtained. Accordingly, even when the position of the mold 10 changes, accurate positioning can be performed for the mold. The fine-motion stage 22 is mounted on the coarse-motion stage 24, and the coarse-motion stage 24 is configured so as to be movable in the X and Y directions. Specifically, the coarse-motion stage 24 can be configured using a combination of multi-phase linear motors with which the coarse-motion stage 24 can be driven for long distances in the X and Y directions. Furthermore, using a planar motor, the coarse-motion stage 24 can be configured so as to be movable in the X and Y directions. Using the coarse-motion stage 24, a recessed-and-projecting-pattern transfer position that is set on the substrate 21 can be moved to a position that is immediately below the mold 10.

Next, a basic imprint process will be described.

First step (S1): The substrate stage 2 holds the substrate 21 onto which a resin 20 is applied, and performs positioning so that the recessed-and-projecting-pattern transfer position which is set on the substrate is located at a position which is immediately below the mold 10. As methods for detecting accurate position coordinates of the recessed-and-projecting-pattern transfer position, there are a scheme called die-by-die alignment, in which a mark on the substrate is measured for each of recessed-and-projecting-pattern transfer positions that are different from one another, and a scheme called global alignment, in which a mark at a representative position on the substrate is measured in advance. Positioning of the substrate stage 2 for the position coordinates of the recessed-and-projecting-pattern transfer position that are obtained using either one of the methods is performed on the basis of a measured value of the interferometer 25. In this case, although positioning accuracy depends on the line width of a recessed and projecting pattern, an accuracy that is in the range from the order of sub-nanometers to approximately 10 nm is beneficial as the positioning accuracy.

Second step (S2): By driving the substrate stage 2, the up/down mechanism 14, or both the substrate stage 2 and the up/down mechanism 14, the substrate 21 and the mold 10 are brought close to each other so that the substrate 21 and the mold 10 have a predetermined spacing (of approximately 3 to 10 nm) therebetween. Accordingly, the recessed and projecting pattern, which is formed on the mold 10, is filled with the resin 20, which is applied onto the substrate, so that the resin 20 conforms to the shape of the recessed and projecting pattern. In this manner, it can be considered that the resin and the mold enter a state in which the resin and the mold are in contact with each other when starting to fill the shape of the recessed and projecting pattern with the resin 20. In this case, the posture of the substrate stage 2 is controlled, so that the spacing between the substrate 21 and the mold 10 is uniform.

Third step (S3): The resin 20 is irradiated with UV light in a state in which the recessed and projecting pattern formed on the mold 10 is filled with the resin in the second step, thereby curing the resin 20. The mold 10 on which the recessed and projecting pattern is formed is made of a material through which light such as ultraviolet light can pass. The resin 20 is irradiated with light, such as ultraviolet light, from a light source that is not illustrated, so that the resin 20 applied onto the substrate 21 can be cured.

Fourth step (S4): After the resin 20 is cured in the third step, the substrate stage 2, the up/down mechanism 14, or both the substrate stage 2 and the up/down mechanism 14 are driven so that the spacing between the substrate 21 and the mold 10 is increased, thereby separating the cured resin 20 from the mold 10. This process is called mold release.

Figure 2:
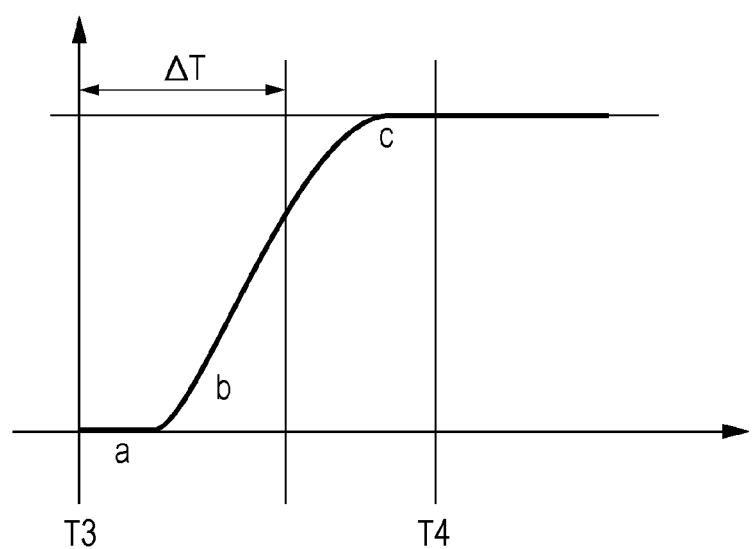
FIG. 2 is a diagram illustrating change in the stiffness of a resin with time in a third step of an imprint process.
Figure 3A:
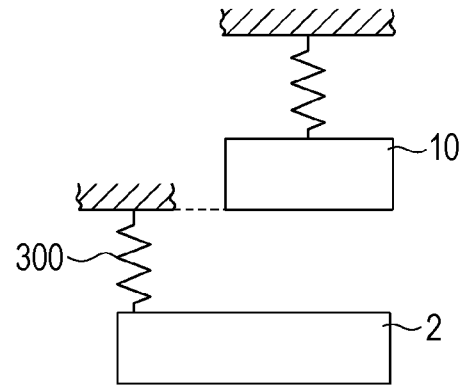
FIGS. 3A to 3C are diagrams illustrating influences of the stiffness of the resin in the third step of the imprint process.
Figure 3B:
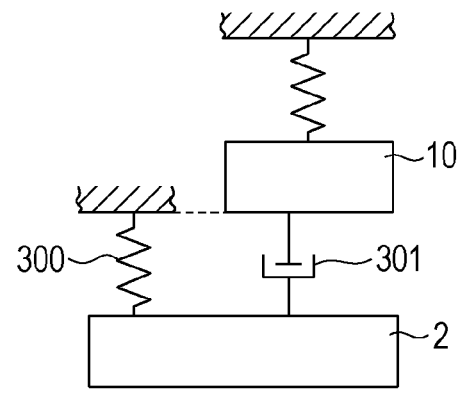
Figure 3C:
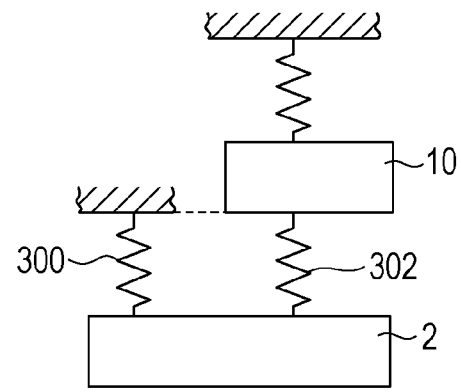

Next, the third step will be described in detail. FIG. 2 illustrates a relationship between the irradiation time with UV light and the stiffness of the resin 20. The horizontal axis indicates the time elapsed since the start of irradiation with UV light. T3 indicates the start of irradiation with UV light. T4 indicates the completion of irradiation with UV light. The vertical axis indicates the stiffness of the resin 20, which is changing. Furthermore, FIG. 3 includes diagrams schematically illustrating changes in an interaction between the mold 10 and the substrate stage 2, which are caused by changes in the stiffness of the resin 20. Although only the interaction in one axial direction is illustrated for simplicity in the drawings, the same is true for all six axial directions. Moreover, steps a, b, and c that are illustrated in FIG. 2 correspond to states illustrated in FIGS. 3A, 3B and 3C, respectively. The resin 20 prior to being irradiated with UV light is in a liquid state, and has a high liquidity. It can be considered that the stiffness of the resin 20 in the horizontal direction (the X and Y directions) is almost zero. For this reason, the resin 20 causes almost no interaction between the substrate stage 2 and the mold 10 to occur. In contrast, the substrate stage 2 is subjected to positioning for the mold 10 by a position control system that is described below. In this case, when the mold supporting mechanism 1 is viewed from the substrate stage 2 side, it can be considered that the mold supporting mechanism 1 is connected to the substrate stage 2 due to a servo stiffness 300, which is represented as an equivalent element, of the position control system (FIG. 3A). In this case, in order to increase the positioning accuracy, the position control gain of the substrate stage is set to be high. When irradiation with UV light starts, the resin 20 starts being cured. As the resin 20 is cured, the stiffness of the resin 20 increases as illustrated in FIG. 2, and it can be considered that the mold 10 and the substrate stage 2 are in a state in which a damping element 301 is connected between the mold 10 and the substrate stage 2 (FIG. 3B). In this state, because the resin 20 still has liquidity, the mold 10 and the substrate stage 2 can be relatively moved. For this reason, because there is a possibility that the position of the mold 10 and the position of the substrate 21 are shifted from each other and that the resin 20 is cured, it is necessary to maintain a high positioning accuracy. After that, curing further progresses. When ΔT has elapsed since the start of irradiation with UV light, the stiffness of the resin 20 increases, and the liquidity thereof decreases. Thus, it can be considered that the resin 20 is equivalent to a spring 302. In other words, the mold 10 and the substrate stage 2 are in a state in which the servo stiffness 300 of the position control system of the substrate stage 2 and the spring 302 arising from the stiffness of the resin 20 are interposed therebetween in parallel (FIG. 3C). That is, even when a force for shifting the position of the mold 10 and the position of the substrate 21 from each other is exerted, the mold 10 and the substrate 21 attempt to return to their original positions due to the force of the spring 302. Thus, it is not necessary to maintain a high positioning accuracy. Even when the stiffness of the resin has not reached a saturation level, it can be considered that the mold 10 and the substrate 21 are in a state in which a spring arising from the stiffness of the resin is interposed therebetween.

For this reason, a spring stiffness for the entire substrate stage 2 becomes higher than a spring stiffness that is measured before curing starts. This is equivalent to increase of the gain of the position control system. When the gain is further increased in a state in which the gain is set to be as high as possible in the first place in order to achieve a high positioning accuracy, the gain margin of the position control system becomes zero, and the position control system may become unstable.

Although the positioning accuracy of the fine-motion stage 22 is very high, a positioning error cannot be reduced to zero. For this reason, even in a cured state, a slight positioning error remains. In this case, in order to remove the positioning error, the position control system generates a manipulating variable to attempt to drive the linear motors 23. However, because the resin is cured and the stage is not moved, the position control system generates a larger manipulating variable to attempt to move the stage. In this state, because a force generated by the linear motor 23 is exerted on the cured resin 20, an excessive force is exerted on the resin 20, and breaks the recessed and projecting pattern formed on the resin 20.

Furthermore, in the state illustrated in FIG. 3A, a force for driving the substrate stage 2 is not transmitted to the mold 10 side. When the resin is cured, the substrate stage 2 and the mold supporting mechanism 1 are connected due to the stiffness of the resin. Thus, vibration in the case of driving the substrate stage 2 is transmitted to the mold supporting mechanism 1. For this reason, the spring arising from the mechanical stiffness of the mold supporting mechanism 1 is caused to excite, and a possibility that the spring oscillates also arises.

In contrast, regarding the vertical (Z) direction, because the thickness of the resin is very small, approximately a few nanometers, the resin starts having viscosity/stiffness that is caused by surface tension or capillary action in a filled state (the second step). For this reason, the above-described state may start occurring in the second step.

First Embodiment

Figure 4A:
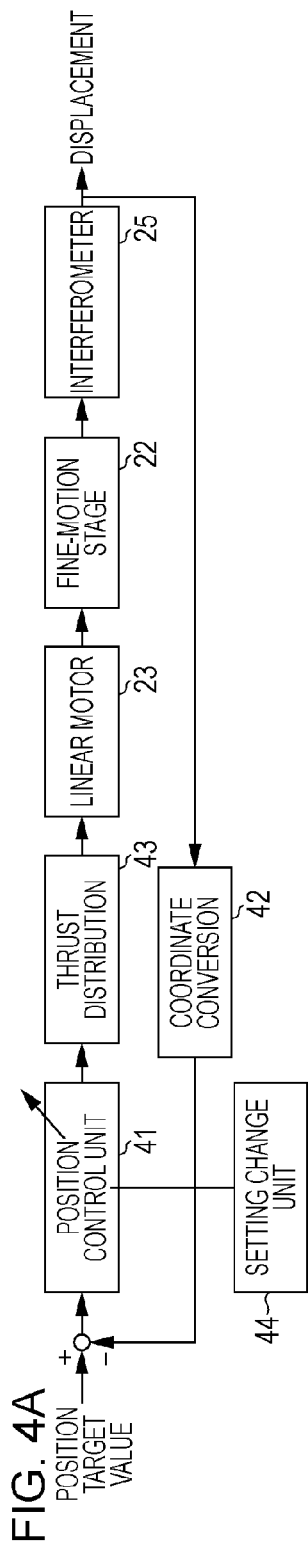
FIGS. 4A to 4C block diagrams of a fine-motion-stage control device of an imprint apparatus according to a first embodiment of the present invention.
Figure 4B:
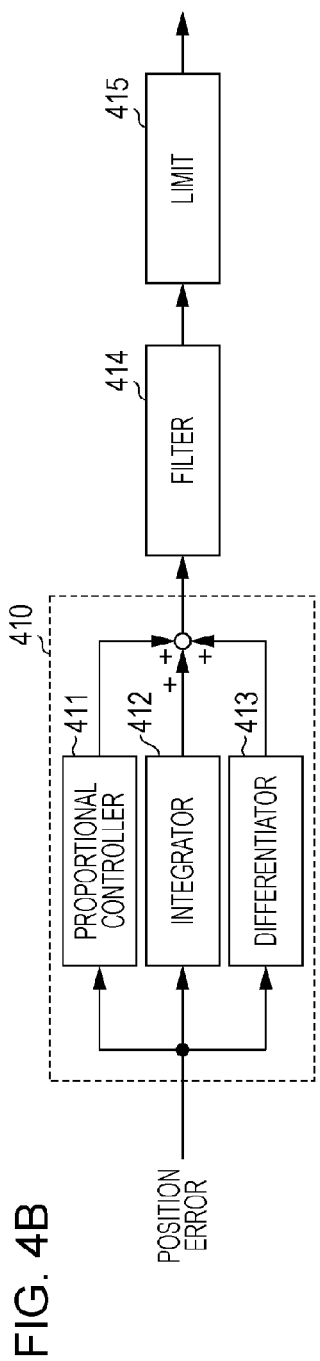
Figure 4C:
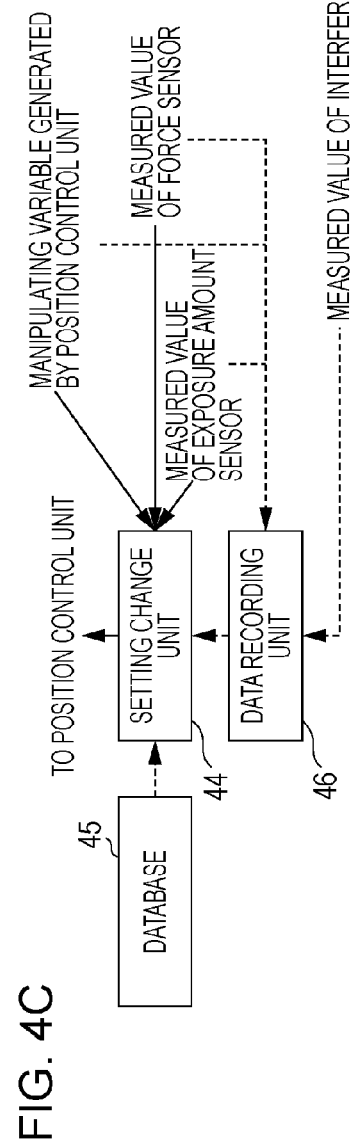

FIG. 4 includes block diagrams of a position control system including the control device 4 that controls the operation of the fine-motion stage 22 of an imprint apparatus according to a first embodiment. FIG. 4A illustrates an overall configuration of the position control system. FIG. 4B illustrates an example of a detailed configuration of a position control unit 41. FIG. 4C illustrates an example of a detailed configuration illustrating data items that a setting change unit 44 refers to.

The position of the fine-motion stage 22 is measured by the interferometer 25 that is placed on the body 31. A value of the measured position is converted by coordinate transformation 42 into values in a coordinate system using X, Y, θz, Z, θx, and θy. The position control unit 41 generates manipulating variables in the individual axes on the basis of the difference between a target position that is obtained using the die-by-die alignment or the global alignment and the value of the measured position. The manipulating variables are converted by thrust distribution 43 into instruction values for the individual linear motors 23. The instruction values are converted by the individual linear motors 23 into driving forces, and the fine-motion stage 22 is driven by the driving forces.

The position control unit 41 will be described in detail using FIG. 4B. Although only a control system corresponding to one axis is illustrated in the present block diagram, control systems, the number of control systems corresponding to the number of control axes, are provided in reality. Furthermore, the same is true in the below description for all of the control axes (X, Y, θz, Z, θx, and θy) of the fine-motion stage 22 as long as there is no specific description. The position control unit 41 has a PID controller 410 that includes a proportional controller 411, an integrator 412, and a differentiator 413. Furthermore, the position control unit 41 may have a filter 414, such as a lowpass filter or a notch filter, for stabilizing the control system. The lowpass filter or notch filter has a function of stabilizing the control system by reducing a gain and by increasing a gain margin at a resonance frequency of a mechanical system. Moreover, the position control unit 41 may also have a limit 415 that limits the output of the control system. The limit 415 has a function of preventing, by reducing an upper limit value of the absolute value of the manipulating variable, an instruction for an excessive force from being input to the linear motor 23.

The setting change unit 44 changes setting values of the position control unit 41 in accordance with predetermined conditions. The setting values that are changed include individual gain parameters of the proportional controller 411, the integrator 412, and the differentiator 413, a cutoff frequency of the lowpass filter, a cutoff frequency, a cutoff gain, and a width of the cutoff frequency of the notch filter, and a limit value of the limit 415. In accordance with the state of the substrate stage 2 and conditions of the stiffness of the mold supporting mechanism 1 and the stiffness of the resin, one of the setting values may be changed or a plurality of setting values among the setting values may be changed.

Next, how to change the individual setting values and effects that can be obtained by changing the individual setting values will be described.

The PID controller 410 reduces the individual gain parameters, and beneficially the PID controller 410 can reduce a ratio of the manipulating variable to an error between the position of the substrate stage 2 that has been measured by the position measurement unit and the target position. Accordingly, when the stiffness of the resin 20 is imposed to the substrate stage 2 as the resin 20 is cured, the overall stiffness can be made equal to the stiffness of the resin 20 prior to being cured. This can be typically handled by uniformly reducing the individual gain parameters. Except in a case in which the stiffness of the resin 20 is higher than the servo stiffness, the individual gain parameters that have been changed are not reduced to zero. Furthermore, it is not necessary to uniformly reduce the individual gain parameters, and the integral gain and the differential gain can also be individually adjusted. Accordingly, a phase margin can also be ensured in accordance with change in phase characteristics that is caused by adjustment of the filter 414, which is described below.

The filter 414 is set so that the filter 414 reduces the ratio of the manipulating variable to the position error in a specific frequency band in order to prevent the position control system from becoming unstable because of an influence of mechanical resonance of the substrate stage 2 and the mold supporting mechanism 1. Furthermore, a plurality of filters 414 can be used. Because it is only necessary that the substrate stage 2 be stabilized singly before the resin 20 is cured, the cutoff frequency of the notch filter is set to be equal to a resonance frequency of the fine-motion stage 22. After the resin 20 is cured, because the fine-motion stage 22 is connected to the mold supporting mechanism 1 via the resin 20, the fine-motion stage 22 is also influenced by the mechanical resonance of the mold supporting mechanism 1. For this reason, to prevent a manipulating variable from being generated for the mechanical resonance of the mold supporting mechanism 1, a notch filter whose cutoff frequency is set to coincide with a mechanical resonance frequency of the mold supporting mechanism 1 is prepared separately, and the cutoff gain thereof is reduced with the progress of curing. Accordingly, the control characteristics of the fine-motion stage 22 are not deteriorated before the resin 20 is cured. In contrast, after the resin 20 is cured, because the ratio of the manipulating variable at the cutoff frequency is reduced, the fine-motion stage 22 is not influenced by the mechanical resonance of the mold supporting mechanism 1. However, because the notch filter is enabled, a phase delay increases, and the stability may be lost. This case can be handled by individually changing the degrees of adjustment of the gains of the PID controller 410 which is described above. Specifically, the degree of reduction in the gain of the integrator 412 is larger than the degree of reduction in each of the gain of the proportional controller 411 and the gain of the differentiator 413, and compensation for the phase delay can be realized.

As in the case of the notch filter, the adjustment can be performed using the lowpass filter. In a case of the lowpass filter, the cutoff frequency is reduced, and a gain in a band whose frequencies are equal to or higher than the cutoff frequency can be reduced, so that a similar effect can be obtained.

Furthermore, the position control unit 41 may have the limit 415 for stabilizing the control system. The limit 415 can be provided immediately previous to an output to the linear motor 23 which is provided at the final stage of the position control unit 41, or provided in the integrator 412 of the PID controller 410. The limit provided in the integrator 412 has a function of performing control so that integration is no longer performed when an output value exceeds the limit value. Because the limit 415 is provided, no instruction for an output value equal to or larger than the limit value is output to the linear motor 23. Accordingly, the upper limit value of the absolute value of the manipulating variable can be reduced. In the first step, the substrate stage 2 is moved by providing an instruction for a large absolute value of a manipulating variable for the linear motor 23, and positioning is performed for the recessed-and-projecting-pattern transfer position at a high speed. So, the limit value is set to a large value. In contrast, after the resin 20 is cured, to prevent an excessive force from being exerted on the resin 20 and the mold supporting mechanism 1, the limit value is changed so that the maximum output value is at least equal to or smaller than the braking strength of the resin 20.

Next, how the setting values are changed by the setting change unit 44 as time elapses will be described. FIG. 5 include diagrams illustrating examples of a timing at which the settings are changed by the setting change unit 44. In any of the diagrams, the horizontal axis indicates the lapse of time. Furthermore, T3 indicates the start of irradiation with UV light. T4 indicates the completion of irradiation with UV light. Irradiation of UV light starts. As the irradiation time elapses, curing of the resin 20 progresses, and the stiffness of the resin increases. The setting change unit 44 holds a change pattern for reducing the gains of the PID controller 410 by changing the individual setting values, which are described above, and provides, for the individual control unit, instructions for changing the individual setting values.

In FIG. 5A, after a predetermined time ΔT has elapsed since the start of irradiation of UV light, the setting change unit 44 starts changing the setting values to reduce the gains of the PID controller 410. The timing at which the ΔT elapses almost coincides with a timing at which the state changes from a state of (b) to a state of (c) illustrated in FIG. 2. It is preferable that the change pattern for reducing the gains have characteristics that are inverse to change in the stiffness with time. However, simply, the gains may be linearly changed. If the progress of curing of the resin with the lapse of time has repeatability, sufficient performance can be achieved in the present manner.

In FIG. 5B, the setting change unit 44 can start changing the setting values on the basis of a measured value of an exposure amount sensor 16 that measures the amount of exposure to UV light when the amount of exposure to UV light reaches a predetermined exposure amount. The timing at which the amount of exposure reaches the predetermined exposure amount almost coincides with the timing at which the state changes from the state of (b) to the state of (c) illustrated in FIG. 2. Because changing of the setting values is performed on the basis of the measured value of the exposure amount sensor 16, even when the light intensity of UV light emitted from the light source fluctuates, changing of the setting values can be performed at an appropriate timing. The exposure amount sensor 16 can be provided in any place in which the amount of light with which the resin is irradiated can be measured, such as the mold chuck 11.

In FIG. 5C, the setting change unit 44 monitors the manipulating variable that is output by the position control unit 41 which is provided along each of the axes of the fine-motion stage 22. When the manipulating variable changes from a value that has been measured before curing starts by a predetermined amount, the setting change unit 44 can start changing the setting values. In this case, only when the position control unit 41 generates an excessive output and an excessive force is exerted on the mold 10 or the resin 20, the setting change unit 44 can change the setting values. For this reason, the setting values are not changed as long as the position control unit 41 maintains the stability. Furthermore, instead of the manipulating variable, the setting change unit 44 can also start changing the setting values on the basis of a measured value of a force sensor 15 that is included in the mold supporting mechanism 1 when the measured value of the force sensor 15 changes from a value that has been measured before curing starts by a predetermined amount. Also in this case, the position control unit 41 can be configured to change the setting values only when an excessive force is exerted on the mold 10 or the resin 20 and the measured value of the force sensor 15 becomes large. Further, instated of the manipulating variable, the instruction value that is provided from the control unit to the actuator with which the stage is driven can be used. In other words, when the instruction value exceeds a predetermined value, the setting change unit 44 changes the setting values.

Furthermore, regarding one of the manipulating variable, the measured value of the force sensor, and the instruction value, the setting change unit 44 can also be configured to change the setting values when the amplitude of vibration of the value at a specific frequency exceeds a predetermined value. Specifically, one of the manipulating variable, the measured value of the force sensor, and the instruction value is monitored using a bandpass filter that causes the resonance frequency at a time at which the mechanical stiffness of the mold supporting mechanism 1 is connected to the stage due to the stiffness of the resin to pass through. When the amplitude exceeds the predetermined value, the setting change unit 44 changes the setting values.

Moreover, the setting change unit 44 can be used using a combination of the individual conditions given above. For example, a configuration can also be used, in which both the exposure amount sensor 16 and the force sensor 15 measure values, and in which the setting values are changed when either the measured value of the force sensor 15 or the measured value of the exposure amount sensor 16 first exceeds a predetermined value. Here, changing of the setting values includes reduction of the individual gains of the PID controller 410, reduction of the cutoff frequency of the filter 414, and reduction of the limit value of the limit 415.

Additionally, regarding change in the stiffness of a resin in accordance with the amount of exposure to UV light, a database 45 can be provided, in which, for each of types of resins that are considered as resins to be used, a relationship between the amount of exposure to UV light and change in the stiffness of the resin is recorded in advance. Because the progress of curing for the amount of exposure to UV light differs in accordance with the type of resin, the optimum value of a timing at which the setting change unit 44 starts changing the setting values and the optimum value of the change pattern differ for each of the resins. The setting change unit 44 can select, with reference to the database 45, the optimum timing at which the setting change unit 44 starts changing the setting values and the optimum change pattern to a resin that is to be used. The database 45 can record change in viscosity or change in viscoelasticity, and the change in viscosity or the change in viscoelasticity can be used instead of the change in the stiffness of the resin.

In addition, a data recording unit 46 may be provided, which records log data regarding at least one of the value of the measured position of the substrate stage 2, the manipulating variable for each of the axes, the measured value of the force sensor 15, and the measured value of the exposure amount sensor 16 in the course of curing of the resin. Even when the same type of resin 20 is used, the degree of progress of curing may differ in accordance with the recessed and projecting pattern that the mold 10 has, and, further, the optimum value of the timing at which the setting change unit 44 starts changing the setting values may differ. Hence, the change start timing and the change pattern can be switched to a more optimal change start timing and a more optimal change pattern with reference to the recorded log data. Furthermore, because the optimized change start timing and the optimized change pattern are recorded in the database 45, the optimum values can be used for the next time and times subsequent thereto.

The things in the above description are performed for all of the control axes (X, Y, θz, Z, θx, and θy) of the fine-motion stage 22. However, the setting values that are to be changed, the change start timing, and the change pattern may differ for each of the axes of the fine-motion stage 22. Regarding a contact direction (the Z direction) in which the mold 10 and the substrate 21 are in contact with each other, because a low positional accuracy is desired, high stability in this direction is beneficial, and it is preferable that the gain in this direction be reduced earlier than when the gains in the other control axes are reduced. Furthermore, regarding the contact direction, because the resin is very thin, it can be considered that the resin 20 starts having some degree of stiffness in the filling step (the second step). Accordingly, changing of the settings may be performed in a resin filling step (the second step, a state in which the resin and the mold are in contact with each other). In contrast, the horizontal direction (X, Y, and θz) needs a high positioning accuracy for positioning of the mold 10 and the substrate 21. When the gain is reduced at an early step, there is a possibility that position shift occurs. Thus, it is preferable that the gain be maintained until curing has progressed sufficiently.

As described above, the recessed and projecting pattern that has been transferred onto the resin 20 can be prevented by reducing the position control gain from being broken. Furthermore, the stiffness of the substrate stage does not cause the control system to become unstable, and a favorable positional accuracy of the substrate stage 2 can be maintained. Here, reduction of the position control gain means reduction of a ratio of an output to an input of the position control unit 41, i.e., to the error between the position of the stage that has been measured by the position measurement unit and the target position.

Moreover, in the present embodiment, a UV-curing-type imprint apparatus is described. However, light is not limited to UV light. A light source that emits light other than UV light may be used. Additionally, in addition to the light-curing-type imprint apparatus, the present invention can be similarly applied to a thermosetting-type imprint apparatus.

Second Embodiment

After the resin 20 is cured, a load can be limited by a procedure, such as reduction of the gain or reduction of the limit which are described in the first embodiment, so that no excessive load is imposed on the resin 20. However, because it is impossible to directly control a force using position control, it is impossible to perform control so that no load is imposed on the resin 20. In a present embodiment, as the resin 20 is cured, the position control gain is reduced, and, simultaneously, force control is enabled. Accordingly, after the resin 20 is cured, a force exerted on the resin 20 can be controlled to set to be a predetermined force target value.

Figure 6:
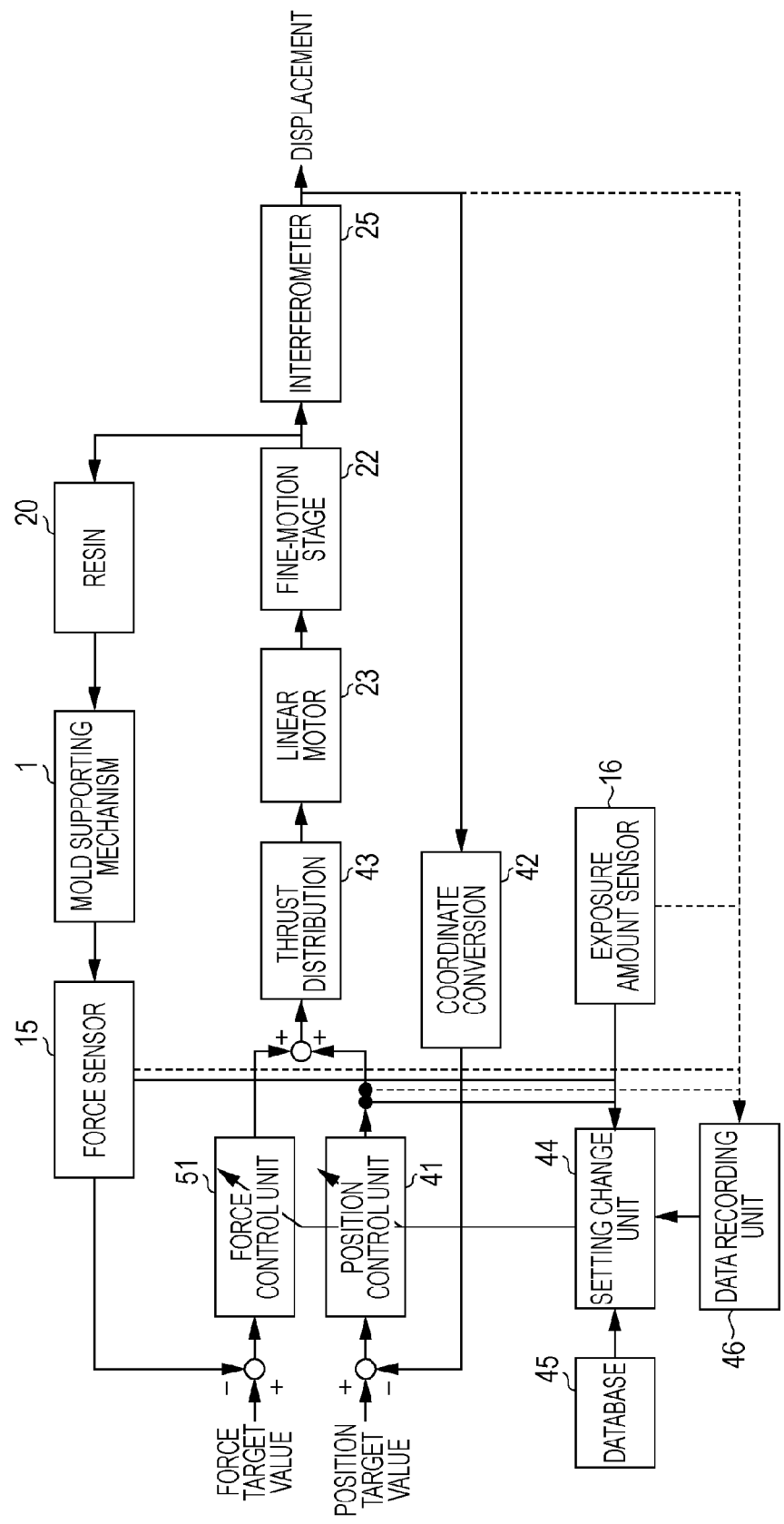
FIG. 6 is a block diagram of a fine-motion-stage control device of an imprint apparatus according to a second embodiment of the present invention.

FIG. 6 is a block diagram of a position control system including the control device 4 that controls the operation of the substrate stage 2 of an imprint apparatus according to the second embodiment.

The present embodiment differs from the first embodiment in that a force control unit 51 is provided together with the position control unit 41. The force control unit 51 includes a PID controller, a filter, and a limit as in the case of the position control unit 41 illustrated in FIG. 4B. The force control unit 51 differs from the position control unit 41 in that an input is not a position error but a force error. The force control unit 51 determines, on the basis of a force error between a measured value of the force sensor 15 included in the mold supporting mechanism 1 and the predetermined force target value, a force manipulating variable that is to be supplied to the fine-motion stage 22 so that the predetermined force target value is exerted on the mold 10. As the force sensor 15, a load cell, a strain gauge, an piezoelectric element, or the like can be used. For example, a strain gauge is attached to the flexure mechanism 12, and the degree of sagging of the flexure mechanism 12 is detected, so the strain gauge can be used as the force sensor. In this case, in order to detect forces in the six axial directions, at least six force sensors are used.

In the second and third steps, regarding the contact direction (the Z direction) in which the mold 10 and the substrate 21 are in contact with each other, in order to cause filling with the resin 20 to progress, it is preferable that a sight pressing force be exerted. In the directions other than the Z direction, it is preferable that no force be exerted in order to prevent the resin 20 from being broken or to prevent position shift from occurring.

Figure 7:
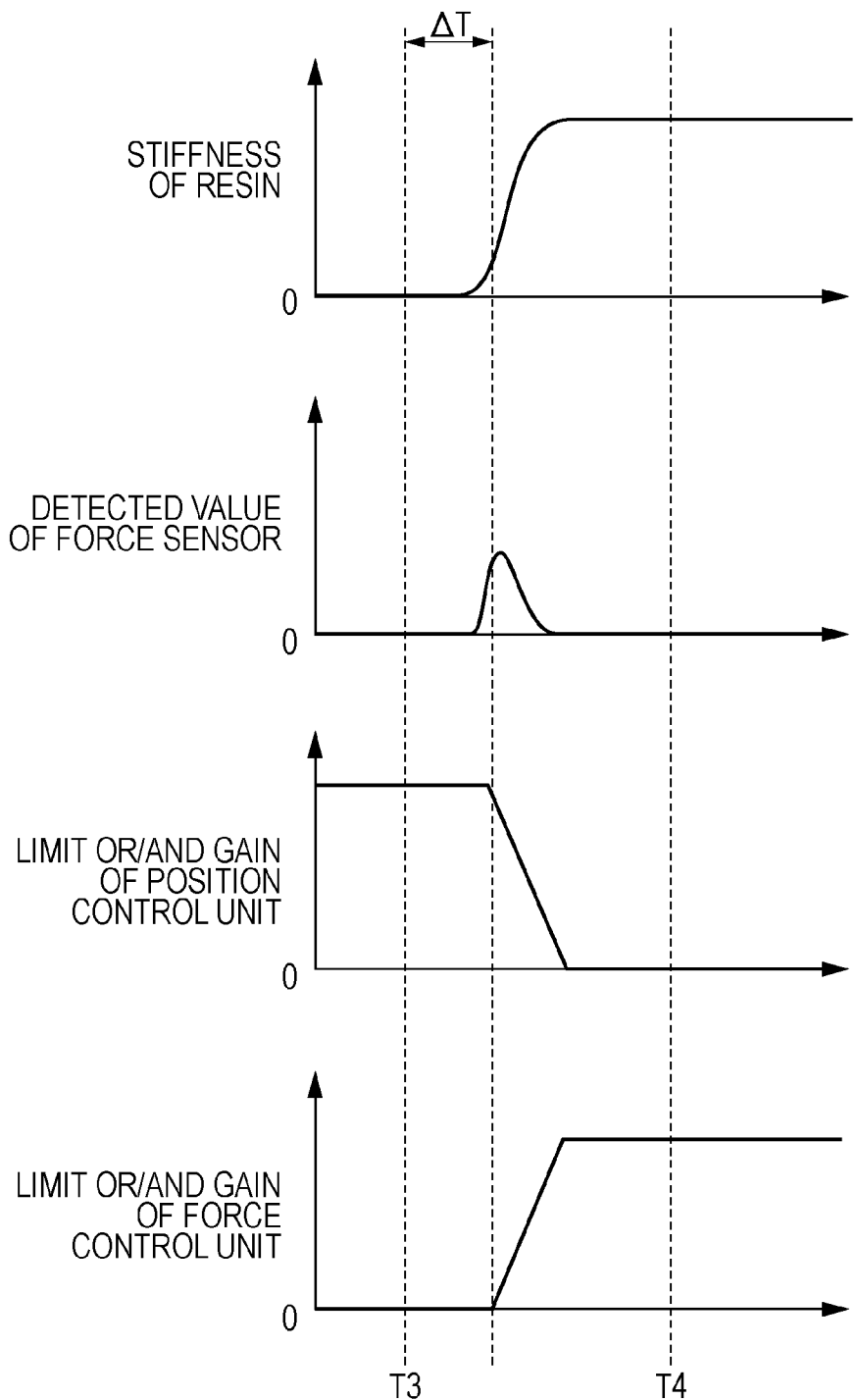
FIG. 7 is a timing diagram of gain change in the second embodiment.

FIG. 7 is a diagram illustrating an example of a timing at which settings are changed by the setting change unit 44. The setting change unit 44 in the present embodiment changes setting values of the position control unit 41, and simultaneously, changes setting values of the force control unit 51. The force control unit 51 is set to be disabled before the resin 20 is cured. This can be realized by setting the gains of a PID controller 410 of the force control unit 51 to be zero or by setting the limit value to be zero. After curing has started, the force control unit 51 is enabled by increasing the limit value or by increasing the gains of the PID controller 410. Furthermore, after the measured value of the force sensor has reached a predetermined value since the start of curing of the resin, a ratio of the manipulating variable that is generated by the position control unit 41 to the position error can be reduced, and a ratio of the manipulating variable that is generated by the force control unit, to the force error can be increased.

The scheme described in the first embodiment can be similarly used to determine a timing at which the setting values of the force control unit 51 are changed and a change pattern.

In the first embodiment, it is unnecessary to disable position control by reducing the individual gains of the PID controller 410 of the position control unit 41 or the limit value to zero. In the present embodiment, because it is difficult to perform accurate force control when the position control unit 41 is enabled, the position control unit 41 is disabled when force control is provided.

As described above, in the present embodiment, after the resin 20 is cured, a load imposed on the resin 20 is directly controlled by switching to force control. Thus, unnecessary load can be prevented from being imposed on the resin, and a more favorable state can be maintained.

Furthermore, a production method for producing a device (a semiconductor integrated circuit element, a liquid-crystal display element, or the like) as an article includes a process of forming a pattern on a substrate (a wafer, a glass plate, or a film substrate) using the above-described imprint apparatuses. Moreover, the production method may include a process of etching the substrate on which the pattern is formed. Note that, in a case of production of another article such as a patterned medium (a recording medium) or an optical element, the production method may include another process of processing the substrate on which the pattern is formed instead of etching. The production method for producing an article in the present embodiment is advantageous in at least one of the performance, quality, productivity, and production cost of the article, compared with a method of the related art.

According to the present invention, the ratio of the manipulating variable to the position error is reduced in a state in which the mold and the substrate are in contact with each other via te resin. Thus, no excessive force is exerted on the resin, and the recessed and projecting pattern can be prevented from being broken.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Application No. PCT/JP2009/071707, filed Dec. 26, 2009, which is hereby incorporated by reference herein in its entirety.

Industrial Applicability

The present invention is suitable, for example, for use in a microfabrication technology for transferring a fine structure on a mold onto a workpiece such as a resin or metal piece.

REFERENCE SIGNS LIST 1 mold supporting mechanism
10 mold
15 force sensor
16 exposure amount sensor
2 substrate stage
20 resin
21 substrate
22 fine-motion stage
4 control device
41 position control unit

What is claimed is:

1. An imprint apparatus that forms a pattern on a substrate by pressing a resin applied onto the substrate and a mold against each other, and cures the resin, the imprint apparatus comprising:
   a stage that holds the substrate; and
   a control unit for controlling the stage by outputting a manipulating variable for the stage on the basis of a position error between the position of the stage that has been measured by a position measurement unit and a target position,
   wherein the control unit is configured to control the stage such that a ratio of the manipulating variable to the position error is reduced according to an increase in stiffness of the resin, while the resin is being cured.

2. The imprint apparatus according to claim 1, wherein the control unit is configured to reduce the ratio of the manipulating variable to the position error after a predetermined time has elapsed since the resin and the mold came into contact with each other.

3. The imprint apparatus according to claim 1, wherein the control unit is configured to reduce the ratio of the manipulating variable to the position error after an instruction value that is provided from the control unit to an actuator with which the stage is driven has exceeded a predetermined value.

4. The imprint apparatus according to claim 1, wherein the control unit is configured to reduce the ratio of the manipulating variable to the position error at a mechanical resonance frequency of a mold supporting mechanism that supports the mold.

5. The imprint apparatus according to claim 1, wherein the imprint apparatus cures the resin using irradiation with light, the imprint apparatus further comprising
   an exposure amount sensor that measures an amount of light from a light source with which the resin is irradiated, and wherein the control unit is configured to reduce the ratio of the manipulating variable to the position error after a measured value of the exposure amount sensor has reached a predetermined value.

6. The imprint apparatus according to claim 1, further comprising a force sensor that measures a load imposed on the mold,
wherein the control unit is configured to reduce the ratio of the manipulating variable to the position error after a measured value of the force sensor has reached a predetermined value.

7. The imprint apparatus according to claim 1, wherein the control unit has a PID controller, and is configured to reduce a ratio of an output to an input of the PID controller.

8. The imprint apparatus according to claim 1, wherein the control unit has a filter, and is configured to reduce a setting value of the filter when an amplitude that passes through the filter has exceeded a predetermined value.

9. The imprint apparatus according to claim 1,
wherein the control unit has a limit that determines an upper limit value of an absolute value of the manipulating variable, and
wherein the control unit is configured to reduce the upper limit value of the limit while the resin and the mold are in contact with each other.

10. The imprint apparatus according to claim 6, further comprising
a force control unit for outputting the manipulating variable based on a force error between the measured value that has been measured by the force sensor and a target value of a load that is to be imposed on the mold,
wherein the force control unit is configured to increase the ratio of the manipulating variable to the force error while the resin and the mold are in contact with each other.

11. The imprint apparatus according to claim 1, wherein the control unit is configured to reduce the ratio of the manipulating variable to the position error for each of axes of the stage.

12. The imprint apparatus according to claim 1, wherein the control unit has a database in which a characteristic change in at least one of viscosity, stiffness, and viscoelasticity in accordance with an exposure amount is recorded for each of a plurality of types of resin that may be used, and
wherein the control unit is configured to select, with reference to the database, in accordance with the type of resin that is used, a timing at which the ratio of the manipulating variable to the position error is reduced, or a change pattern for changing a setting value that is set in the control unit to reduce the ratio of the manipulating variable.

13. The imprint apparatus according to claim 1, further comprising
a data recording unit for recording log data regarding a measured value of the position of the stage or regarding the manipulating variable of the stage,
wherein the control unit is configured to select, with reference to the log data, a timing at which the ratio of the manipulating variable to the position error is reduced, or a change pattern for changing a setting value that is set in the control unit to reduce the ratio of the manipulating variable.

14. A method for producing an article, the method comprising a step of forming, using an imprint apparatus, a pattern in a resin that is applied onto a substrate, the imprint apparatus forming the pattern on the substrate by pressing the resin applied onto the substrate and a mold against each other, and cures the resin,
the imprint apparatus including
a stage that holds the substrate, and
a control unit for controlling the stage by outputting a manipulating variable for the stage based on a position error between the position of the stage that has been measured by a position measurement unit and a target position,
wherein the control unit is configured to control the stage such that a ratio of the manipulating variable to the position error is reduced according to an increase in stiffness of the resin, while the resin is being cured.

15. A method for producing an article, the method comprising:
a step of forming a pattern on a substrate using an imprint apparatus, the imprint apparatus forming the pattern on the substrate by pressing a resin applied onto the substrate and a mold against each other, and cures the resin; and
a step of processing the substrate on which the pattern is formed in the forming step,
the imprint apparatus including
a stage that holds the substrate, and
a control unit for controlling the stage by outputting a manipulating variable for the stage based on a position error between the position of the stage that has been measured by a position measurement unit and a target position,
wherein the control unit is configured to control the stage such that a ratio of the manipulating variable to the position error is reduced according to an increase in stiffness of the resin, while the resin is being cured.

16. An imprint apparatus that forms a pattern on a substrate by pressing a resin applied onto the substrate and a mold against each other, and cures the resin using irradiation with light, the imprint apparatus comprising:
a stage that holds the substrate,
an exposure amount sensor that measures an amount of light from a light source with which the resin is irradiated, and
a control unit for controlling the stage by outputting a manipulating variable for the stage on the basis of a position error between the position of the stage that has been measured by a position measurement unit and a target position,
wherein the control unit is configured to control the stage such that a ratio of the manipulating variable to the position error is reduced according to the amount of light measured by the exposure amount sensor, while the resin is being cured.

17. The imprint apparatus according to claim 16, wherein the control unit is configured to reduce the ratio of the manipulating variable to the position error after a measured value of the exposure amount sensor has reached a predetermined value.

18. An imprint apparatus that forms a pattern on a substrate by pressing a resin applied onto the substrate and a mold against each other, and cures the resin, the imprint apparatus comprising:
a stage that holds the substrate,
a force sensor that measures a load imposed on the mold, and
a control unit for controlling the stage by outputting a manipulating variable for the stage on the basis of a position error between the position of the stage that has been measured by a position measurement unit and a target position, wherein the control unit is configured to control the stage such that a ratio of the manipulating variable to the position error is reduced according to a value measured by the force sensor, while the resin is being cured.

* * * * *